United States Patent
Hayashi et al.

(10) Patent No.: US 6,970,532 B2
(45) Date of Patent: Nov. 29, 2005

(54) METHOD AND APPARATUS FOR MEASURING THIN FILM, AND THIN FILM DEPOSITION SYSTEM

(75) Inventors: Seiichi Hayashi, Tokyo (JP); Jimpei Harada, Tokyo (JP); Tetsuo Kikuchi, Tokyo (JP); Kazuhiko Omote, Tokyo (JP); Katsuhiko Inaba, Tokyo (JP)

(73) Assignee: Rigaku Corporation, Tokyo (JP)

( * ) Notice: Subject to any disclaimer, the term of this patent is extended or adjusted under 35 U.S.C. 154(b) by 59 days.

(21) Appl. No.: 09/852,111

(22) Filed: May 9, 2001

(65) Prior Publication Data

US 2001/0043668 A1 Nov. 22, 2001

(30) Foreign Application Priority Data

May 10, 2000 (JP) ..................... 2000-137629

(51) Int. Cl.⁷ .............................. G01N 23/20
(52) U.S. Cl. ..................... 378/79; 378/70
(58) Field of Search .............. 378/70, 79, 89, 378/80, 73; 505/447; 118/715, 635, 504

(56) References Cited

U.S. PATENT DOCUMENTS

| | | | | |
|---|---|---|---|---|
| 3,645,623 A | * | 2/1972 | Patten ..................... 356/3.08 |
| 5,046,077 A | * | 9/1991 | Murayama ................. 378/73 |
| 5,336,324 A | * | 8/1994 | Stall et al. ................ 118/719 |
| 5,619,548 A | * | 4/1997 | Koppel .................... 378/70 |
| 5,755,877 A | * | 5/1998 | Kamakura et al. ......... 117/85 |
| 5,895,622 A | * | 4/1999 | Ramani et al. ........... 264/440 |
| 6,511,544 B2 | * | 1/2003 | McKee et al. ............ 118/665 |

FOREIGN PATENT DOCUMENTS

| JP | 09181006 A | * 7/1997 | ......... H01L/21/205 |
| JP | 11-14561 | 1/1999 | |

OTHER PUBLICATIONS

1997—X-ray Reflectometer for the Diagnostics of Thin Films During Growth, U. Niggemeier, K. Lischka, W. M. Plotz and V. Holy, Journal of Applied Crystallography, vol. 30, pp. 905–908.

Niggemeier et al., Feb. 7, 1997, Journal of applied Crystallography, 905–908.*

* cited by examiner

*Primary Examiner*—Edward J. Glick
*Assistant Examiner*—Hoon Song
(74) *Attorney, Agent, or Firm*—Jordan and Hamburg LLP

(57) ABSTRACT

The thin film deposition system for depositing a thin film on the surface of substrates disposed in a sealed thin film deposition furnace comprises a measuring unit at a site communicating with the thin film deposition furnace, the measuring unit comprising a thin film deposition sample substrate for allowing a thin film substance flowing in from the thin film deposition furnace to adhere while X-ray incidence and extraction windows being provided on the side walls of the measuring unit, wherein X-ray is irradiated on the thin film deposition sample substrate in the measuring unit through the X-ray incidence window by means of a thin film measuring unit provided at the outside of the thin film deposition furnace, and the X-ray reflected from the thin film deposition sample substrate is sensed through the X-ray extraction window.

5 Claims, 15 Drawing Sheets

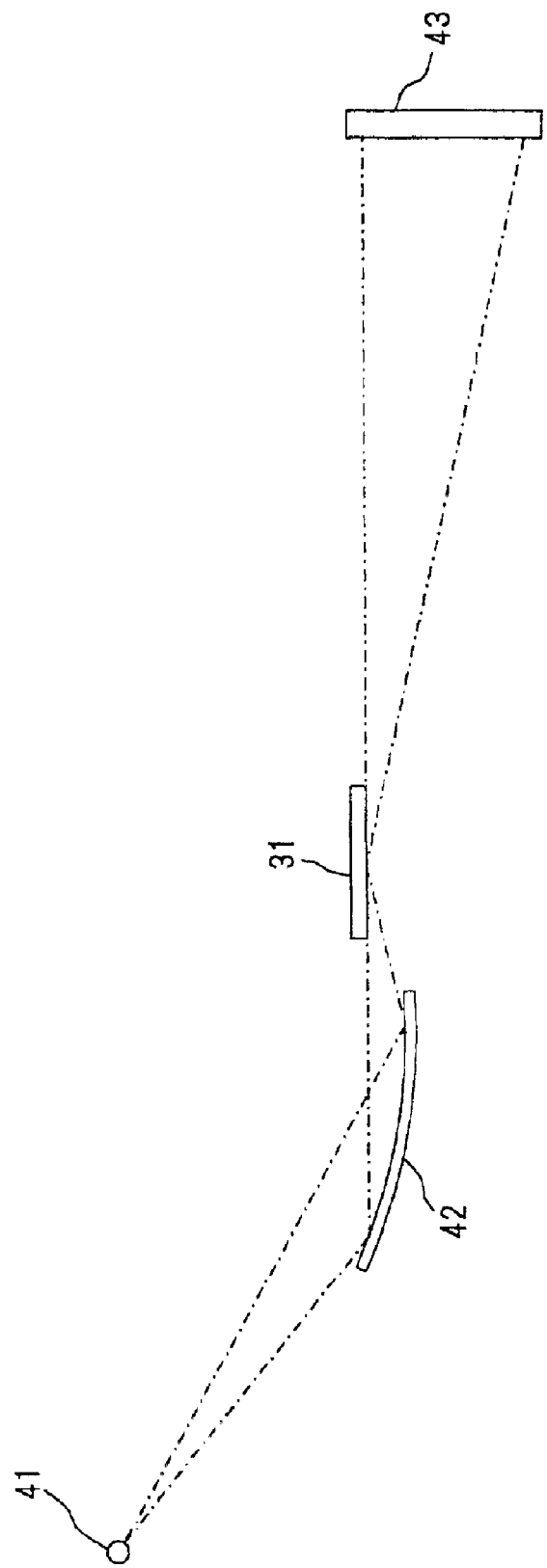

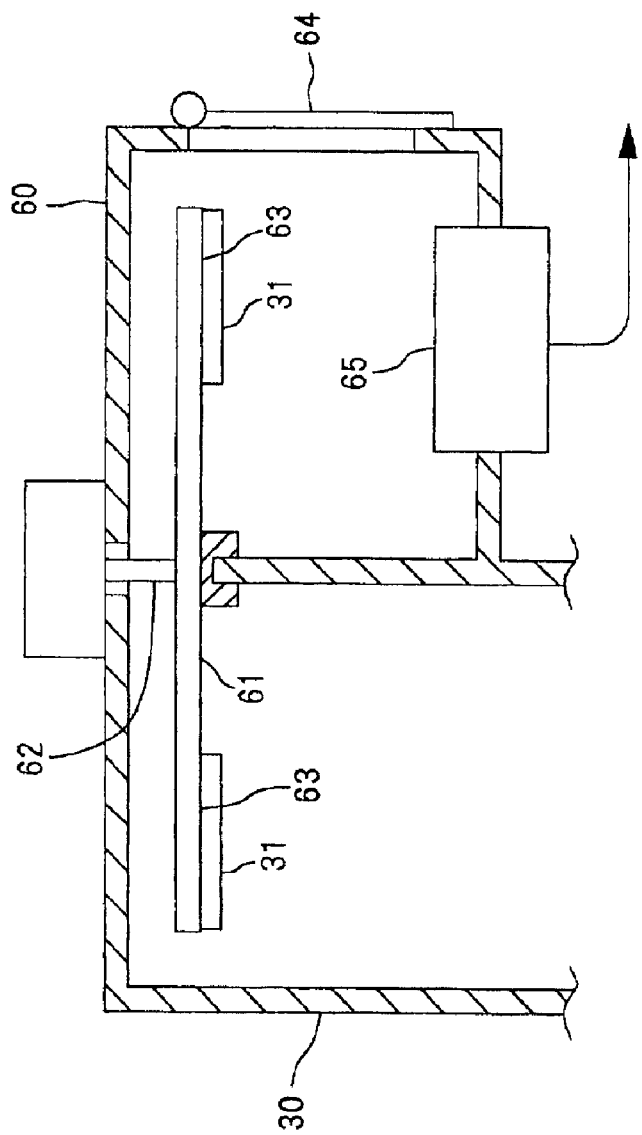

METHOD AND APPARATUS FOR MEASURING THIN FILM, AND THIN FILM DEPOSITION SYSTEM

BACKGROUND OF THE INVENTION

1. Field of the Invention

The present invention relates to the field of thin film deposition technologies for allowing real time in-situ measurements of deposited thin films.

2. Description of the Related Art

Real time in-situ measurements of deposited thin films formed on the surfaces of a substrate in a thin film deposition furnace are quite important for depositing the thin film with high accuracy.

An optical thin film measuring apparatus taking advantage of laser interferometry has been known in the art as the thin film measuring apparatus as described above.

This optical thin film measuring apparatus is particularly applied for measuring a transparent thin film such as a dielectric material. In this optical thin film measuring apparatus, a laser beam is irradiated on the surface of a thin film deposition substrate disposed in a thin film forming furnace, and the intensity of the beam reflected from the surface is sensed using a photo-cell. The intensity of the reflected light sensed with the photo-cell exhibits a periodic characteristic due to interference between the reflected light from the surface of the substrate and the reflected light from the surface of the thin film, and the thickness of the thin film is measured by the number of interference cycles.

However, the conventional optical thin film measuring apparatus involves a measuring limit ascribed to the wavelength of the light used, and a measuring accuracy exceeding the critical accuracy cannot be expected.

Required levels in the industrial fields for the production of the thin film have became quite high in recent years, often claiming a quite high level accuracy of several angstroms for the thickness of the thin film. Accordingly, a thin film measuring apparatus that can replace the optical thin film measuring apparatus has been desired.

SUMMARY OF THE INVENTION

Accordingly, it is an object of the present invention for solving the foregoing problems to provide a method for allowing a quite high accuracy of real time in-situ measurement of deposited thin films on the surface of a substrate in a thin film deposition furnace.

Another object of the present invention is to provide a method for forming a thin film with high accuracy based on measured data of the thin film using a X-ray.

In a first aspect, the present invention for attaining the foregoing objects provides a thin film deposition system comprising a sealed thin film deposition furnace comprising a X-ray permeable X-ray incidence window and X-ray extraction window, a thin film substance generating device for generating thin film deposition particles of a thin film substance in the thin film deposition furnace, a substrate support member for supporting a thin film deposition substrate in the thin film deposition furnace at a position for allowing the thin film deposition particles of the thin film deposition substance generated from the thin film substance generating device to adhere on the surface of the substrate, a X-ray irradiation unit disposed at the outside of the thin film deposition furnace for irradiating a X-ray through the X-ray incidence window toward the surface of the thin film deposition substrate supported in the thin film deposition furnace, and a X-ray sensing unit disposed at the outside of the thin film deposition furnace for sensing the X-ray reflected from the thin film deposition substrate through the X-ray extraction window, the X-ray irradiation unit comprising a X-ray source for emitting a divergent X-ray, and a curved monochromator for at least converting the divergent X-ray emitted from the X-ray source into a monochromatic X-ray and for allowing the monochromatic X-ray to converge on the thin film deposition surface of the thin film deposition substrate.

A thin film measuring apparatus comprises the X-ray irradiation unit and X-ray sensing unit among the constitution members described above.

According to the first aspect of the present invention, a X-ray is irradiated through the X-ray incidence window toward the surface of the thin film deposition substrate, and the reflected X-ray from the thin film deposition substrate is sensed through the X-ray extraction window, thereby realizing a high accuracy measurement using the X-ray.

It is known in the art that monochromatic X-ray is reflected and converged toward one direction by allowing a divergent X-ray to impinge on a curved monochromator. Accordingly, the X-ray may be simultaneously impinged on the surface of the thin film deposition substrate from a direction within a given angle range by allowing the reflected X-ray from the curved monochromator to converge on the surface of the thin film deposition substrate.

The X-ray may be reflected from the surface of the thin film deposition substrate in a direction within a given angle range depending on the incident angle range of the X-ray. The X-ray measurement time may be shortened by sensing the X-ray reflected in a direction within a given angle range.

In a second aspect, the present invention provides a thin film deposition system comprising a closed thin film deposition furnace, a thin film substance generating device for generating thin film deposition particles of a thin film substance in the thin film deposition furnace, a substrate support member for supporting a thin film deposition substrate in the thin film deposition furnace at a position for allowing the thin film deposition particles of the thin film deposition substance generated from the thin film substance generating device to adhere on the surface of the substrate, a measuring unit provided at a prescribed site communicating with the thin film deposition furnace and being capable of disposing the thin film deposition substrate that serves as a thin film deposition sample substrate as a measuring object at a position for allowing the thin film deposition particles of the thin film substance flowing in from the thin film deposition furnace to adhere on the surface of the substrate, a X-ray incidence window and extraction window provided on the side walls of the measuring unit, a X-ray irradiation unit provided at the outside of the thin film deposition furnace and irradiating a X-ray through the X-ray incidence window toward the surface of the thin film deposition sample substrate disposed within the measuring unit, and a X-ray sensing unit provided at the outside of the thin film deposition furnace and sensing the X-ray reflected from the thin film deposition sample substrate through the X-ray extraction window, the X-ray irradiation unit comprising a X-ray source for emitting a divergent X-ray, and a curved monochromator for at least converting the divergent X-ray emitted from the X-ray source into a monochromatic X-ray and for allowing the monochromatic X-ray to converge on the thin film deposition surface of the thin film deposition sample substrate.

According to the present invention, the X-ray measuring apparatus may be flexibly disposed by taking the surrounding environment into consideration, since a measuring unit comprising the X-ray incidence window and X-ray extraction window on the side walls is separately provided.

According to the second aspect of the present invention, a thin film deposition sample substrate disposed in the measuring unit or the surface thereof may be exchanged without altering the atmosphere in the thin film deposition furnace.

While a plurality of the thin film layers are deposited on the thin film deposition substrate, the sample substrate or the surface thereof is exchanged by means of the exchange device every time when measurement of each thin film layer comes to its end, thereby enabling each thin film layer to be independently selected and measured with high precision.

In a third aspect, the present invention provides a thin film deposition system comprising a sealed thin film deposition furnace having a X-ray permeable X-ray incidence window and X-ray extraction window, a thin film substance generating device for generating thin film deposition particles of a thin film substance in the thin film deposition furnace, a substrate support member for supporting a thin film deposition substrate in the thin film deposition furnace at a position for allowing the thin film deposition particles of the thin film deposition substance generated from the thin film substance generating device to adhere on the surface of the substrate, a shield member provided in opposed relation to the surface of the thin film deposition substrate supported in the thin film deposition furnace, an opening for depositing the thin film formed at a part of the shield member and for allowing a part of the thin film deposition substrate to expose so that the thin film deposition particles of the thin film deposition substance generated from the thin film substance generating device are adhered on the exposed part, an opening for depositing a sample thin film formed at another part of the shield member and for allowing another part of the thin film deposition substrate to expose so that the thin film deposition particles of the thin film deposition substance generated from the thin film substance generating device are adhered on the another exposed part, a rotary drive device for relatively changing a part of the surface facing the opening for depositing the sample thin film by allowing the thin film deposition substrate to rotate, a X-ray irradiation unit disposed at the outside of the thin film deposition furnace and irradiating a X-ray through the X-ray incidence window and the opening for depositing the sample thin film toward a part of the surface of the thin film deposition substrate supported in the thin film deposition furnace, and a X-ray sensing unit disposed at the outside of the thin film deposition furnace and sensing the X-ray reflected from a part of the surface of the thin film deposition substrate through the opening for depositing the sample thin film and the X-ray extraction window, the X-ray irradiation unit comprising a X-ray source for emitting a divergent X-ray, and a curved monochromator or a goniometer (a angle measurement device) for at least converting the divergent X-ray emitted from the x-ray source into a monochromatic X-ray and for allowing the monochromatic X-ray to converge on the surface of the thin film deposition sample substrate.

Preferably, the rotary drive device allows the thin film deposition substrate to rotate for every processes for depositing each thin film layer formed on a part of the surface of the thin film deposition substrate through the opening for depositing the thin film, in order to change a part of the surface facing the opening for depositing the sample thin film.

According to the present invention as described above, the thin film layer deposited on a part of the thin film deposition substrate through the opening for depositing the thin film may be independently analyzed, for example, for every layer.

A thin film similar to the thin film layer as described above may be formed on another part of the surface of thin film deposition substrate facing the opening for depositing the sample thin film, in the process for forming one thin film layer on a part of the thin film deposition substrate through the opening for depositing the thin film. Analysis of one thin film layer deposited on a part of the surface of the thin film deposition substrate through the opening for depositing the thin film is made possible by subjecting the thin film deposited on another part of the surface to X-ray measurement.

Subsequently, the surface portion of the thin film deposition substrate facing the opening for depositing the sample thin film is changed by rotating the thin film deposition substrate. A fresh thin film is then deposited on the portion of the surface facing the opening for depositing the sample thin film in the next thin film deposition process. This thin film is almost the same layer as the thin film layer freshly deposited on a part of the surface of the thin film deposition substrate through the opening for depositing the thin film. Consequently, analysis of the thin film layer freshly deposited on a part of the surface of the thin film deposition substrate through the opening for depositing the thin film is possible by X-ray measurement of the thin film deposited on a part of the surface facing the opening for depositing the sample thin film.

The thin film deposition substrate may be rotated during deposition of the thin film, in order to uniformly deposit the thin film on the surface of the thin film deposition substrate by allowing the shield member to rotate in synchronized relation to the thin film deposition substrate. Synchronized rotation between the thin film deposition substrate and shield member is halted simultaneously with stopping thin film deposition. After completing the measurement of the thin film, the surface portion of the thin film deposition substrate facing the opening for depositing the sample thin film is changed by rotating the thin film deposition substrate.

The thin film deposition system according to the present invention may comprise a control unit for controlling, by previously storing desired basic information for forming a thin film in the thin film deposition furnace, at least forming of the thin film and measurement of the thin film formed on the surface of the thin film deposition substrate based on the basic information.

Providing such control unit as described above permits measuring intervals using the thin film measuring apparatus to be shortened based on the basic information as deposition of the film comes to its end.

For depositing thin films having a desired thickness, measurements of the thin film are repeated with a short cycle and the thickness of the thin film is controlled by feedback of the results of the measurement. A shorter measurement cycle permits an adjustment of the film thickness with high precision. However, thin film deposition should be halted during the measurement of the thin film thickness. Therefore, a long time is required for depositing the thin film as the measuring cycle is shorter.

Accordingly, a highly accurate thin film may be actually deposited by reducing the measuring interval as the thin film deposition interval comes close to its end based on the basic information as described above, besides enabling the total working hour to be shortened by reducing the number of measurements as a whole.

X-ray measurements suitable for measuring a thin film include measurements of rocking curve and X-ray reflectivity.

The following setting is preferable in the thin film deposition system when the measuring object is a mixed crystal structure or a superlattice structure deposited on the surface of the thin film deposition substrate having a known Bragg's angle, or when the rocking curve is measured based on the data from the X-ray sensing unit. That is, the mean incident angle of the X-ray impinging on the thin film on the surface of the thin film deposition substrate from the X-ray irradiation unit is set at around the known Bragg's angle.

It is also preferable to set the incident angle of the X-ray impinging on the thin film on the surface of the thin film deposition substrate from the X-ray irradiation unit within a low angle range required for measuring X-ray reflectivity, when X-ray reflectivity is to be measured in the thin film deposition system according to the present invention.

(Measurement of Rocking Curve)

The method for measuring the rocking curve will be described hereinafter.

The rocking curve has been measured for analyzing a mixed crystal film and superlattice structure in a sample in which a mixed crystal film comprising an epitaxial layer grown on a substrate crystal, or in a sample in which different kinds of single crystal thin films are periodically laminated on a substrate crystal (a superlattice structure).

As shown in FIG. 10, a X-ray emitted from a X-ray source 210 is converted into a monochromatic parallel X-ray with a monochromator 211 to impinge on a sample S. The incident angle of the X-ray to the sample S is allowed to change within a minute angle $\omega$ by allowing the sample S to fluctuate by a minute angle $\omega$ relative to the incident X-ray.

X-ray is reflected by the crystal substrate when the incident angle coincides with the Bragg's angle of the crystal substrate by changing the incident angle of the X-ray to the sample S. When the incident angle coincides with the Bragg's angle of the mixed crystal film or superlattice structure, on the other hand, X-ray is reflected from the mixed crystal film or superlattice structure.

The rocking curve as shown in FIG. 11 is obtained by sensing the X-ray reflected from the crystal substrate, mixed crystal film or superlattice structure with a X-ray detector 212 to construct a profile between the incident angle and intensity of X-ray.

The peak profile $I_o$ of the crystal substrate appears independently from the peak profiles $I_p$ of the mixed crystal film and superlattice structure in the rocking curve.

Suppose that the X-ray incident angle (Bragg's angle) where the peak profile $I_o$ of the substrate lattice appears is known. Then, lattice constants of the mixed crystal film and superlattice structure can be relatively determined from the difference ($\Delta\theta$) between the X-ray incident angle where the peak profile $I_o$ of the substrate crystal appears and the X-ray incident angle where the peak profile $I_p$ of the mixed crystal film or superlattice structure appears.

(Measurement of X-ray Reflectivity)

Measurement of the X-ray reflectivity is particularly suitable for measuring the thickness and surface roughness of the thin film, roughness of the interface between the thin film and substrate, and density of the thin film. The principle of the X-ray reflectivity measurement is as follows (see also FIGS. 12 to 15).

As shown in FIG. 12, X-ray is irradiated on the surface of a substance 300 having a flat surface with an angle close to zero to the surface. In other words, a total internal reflection is observed at an angle equal to or lower than a critical angle when the X-ray is irradiated to the substance 300 with a low angle $\theta$. This critical angle is very small, i.e. 0.22° for Si and glass, 0.42° for Ni and 0.57° for Au against CuK$\alpha$ X-ray.

The critical angle varies depending on the electron density of a substance. X-ray can penetrate deeper into the substance as the incident angle of the X-ray becomes larger than the critical angle. In a substance having an ideal surface plane, X-ray reflectivity rapidly decreases in proportion to $\theta^{-4}$ ($\theta$ represents a X-ray incident angle) at an angle equal to or above the critical angle $\theta c$ as shown in the Curve A in FIG. 13. When the surface of the substance is rough, the degree of decrease is enhanced as shown by the broken line B in FIG. 13. In the vertical axis of FIG. 13, $I_o$ represents the incident X-ray intensity while I represents the intensity of the reflection X-ray.

As shown in FIG. 14, the substance as described above is used as the substrate 301, and a different substance having a different electron density is laminated thereon to form a thin film 302. When X-ray is irradiated at a low angle, the X-ray reflected at the interface between the substrate 301 and thin film 302, and the X-ray reflected on the surface of the thin film 302 interfere with each other to increase or decrease their intensities. As a result, a vibration pattern C appears on the reflectivity curve as shown in FIG. 15 due to interference of X-ray.

The thickness of the thin film 302 can be determined from the frequency of the vibration pattern C, and a line of information on the surface and interface can be obtained from angular dependency of the vibration pattern C. In addition, the density of the thin film 302 can be determined by investigating both the vibration pattern and amplitude together.

X-ray reflectivity is usually measured in an angle range of 0° to 5°, or in a wider range of 0° to 10°, as shown in FIGS. 13 and 15.

BRIEF DESCRIPTION OF THE DRAWINGS

FIG. 3 shows a construction of the X-ray measuring apparatus;

FIG. 6 is a cross section of the construction showing one example of the exchange device for the thin film deposition sample substrate;

DESCRIPTION OF THE PREFERRED EMBODIMENTS

The best mode of the embodiments of the present invention will be described hereinafter with reference to the attached drawings.

First Embodiment

Figure 1:
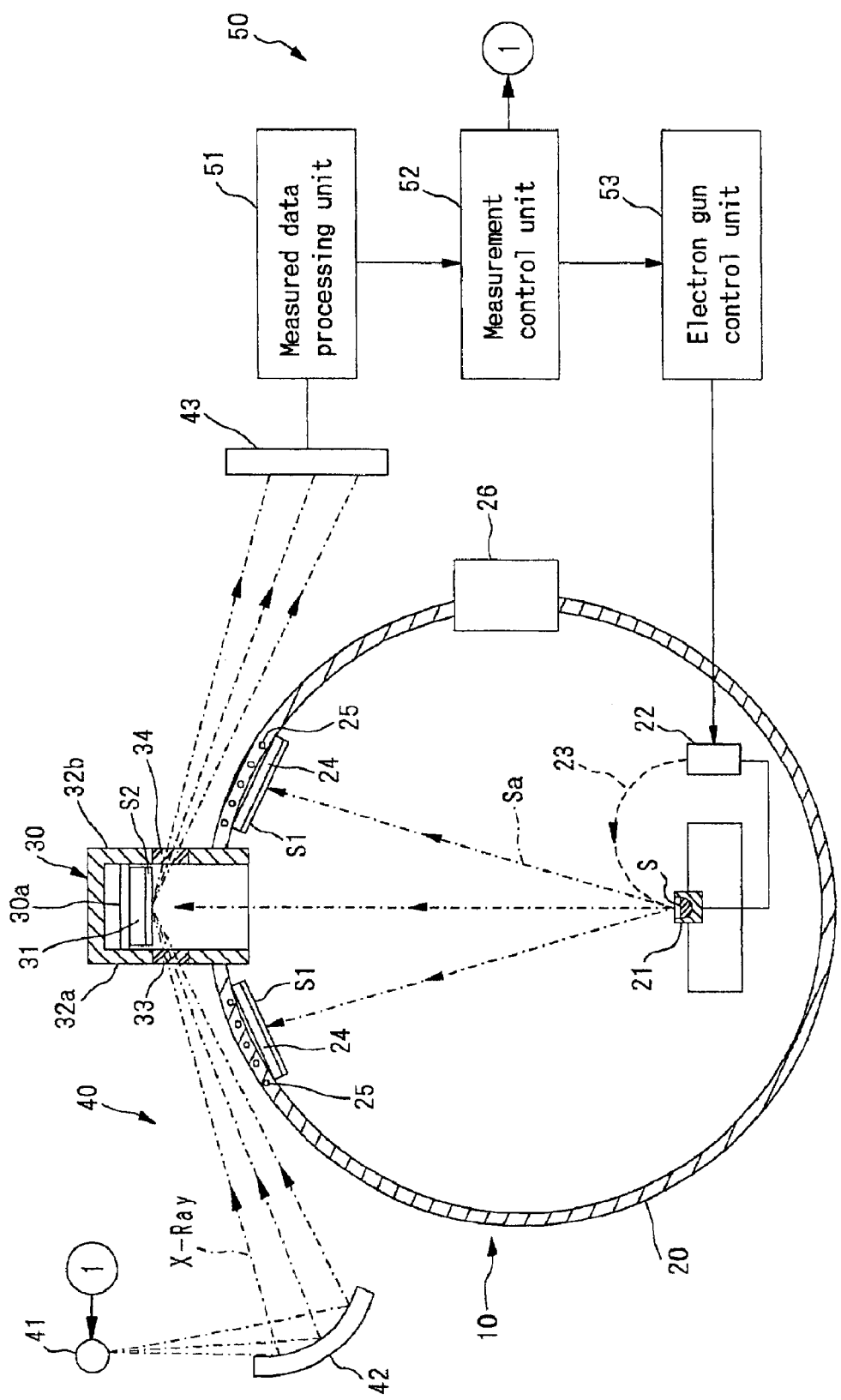
FIG. 1 is a cross section showing the construction of the thin film deposition system according to the first embodiment of the present invention.
Figure 2:
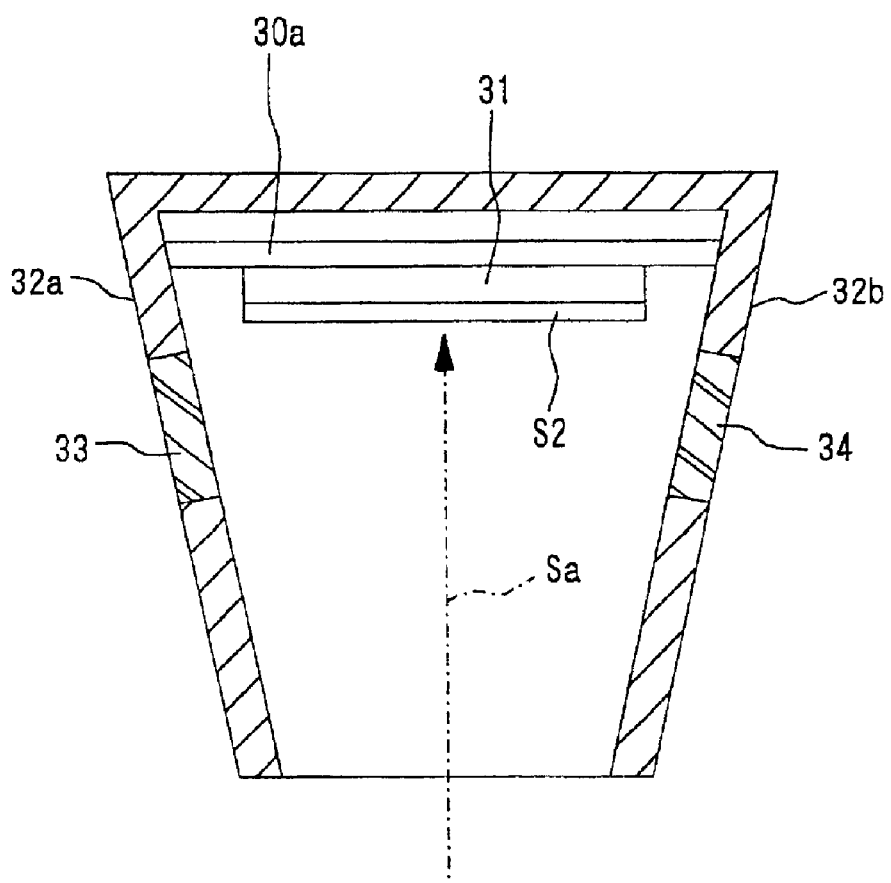
FIG. 2 is cross section showing a modified construction of the measuring unit.

FIG. 1 is a cross section showing the construction of the thin film deposition system according to the first embodiment of the present invention.

The thin film deposition system 10 comprises a thin film deposition furnace 20, a measuring unit 30, a thin film measuring apparatus 40 and a control unit 50.

A thin film is deposited on the surface of the substrate by vacuum deposition in the thin film deposition system 10 shown in this embodiment. A crucible 21 housing a deposition substance S at the bottom and an electric gun 22 are provided in a thin film deposition furnace 20. A thin film generating device comprises the crucible 21 and electron gun 22.

An electron beam 23 is irradiated from the electron gun 22 toward the deposition substance S (thin film substance) in the crucible 21, and the deposition substance S is heated and melts by the electron beam 23, followed by evaporation. The evaporated deposition substance S forms thin film deposition particles Sa, which ascend in the thin film deposition furnace 20. The particles adhere on the surface of a substrate 24 (a thin film deposition substrate) is disposed in opposed relation to the crucible 21 at the upper part of the thin film deposition furnace 20 to form a thin film S1.

The substrate 24 is supported by a support member (substrate support member) known in the art that can support the back face of a plate.

A heater 25 is placed in the vicinity of the substrate 24, which heats the substrate 24 to reduce temperature difference between the substrate and the thin film deposition particles Sa.

An evacuation device 26 is connected to the thin film deposition furnace 20, and a vacuum is formed with the evacuation device 26 in the thin film deposition furnace 20.

The measuring unit 30 is provided in the vicinity of the site for disposing the substrate 24, or at the site facing the crucible 21 as a source for generating the thin film deposition particles Sa for example, so as to communicate with the ceiling of the thin film deposition furnace 20. The measuring unit 30 is formed by protruding a part thereof from the thin film deposition furnace 20, and communicates with the inside of the thin film deposition furnace 20 with its bottom open. The thin film deposition particles Sa ascend through the opening at the bottom of the measuring unit communicating with the inside of the thin film deposition furnace 20.

A sample substrate attachment member 30a is provided at the upper part of the measuring unit 30 facing the crucible 21, where a thin film deposition sample substrate 31 is attached. The thin film deposition sample substrate 31 is made of the same materials as the material of the substrate 24.

The object of measurement of the thin film measuring apparatus 40 is thin films formed on the surface of the thin film deposition sample substrate 31.

The sample substrate attachment member 30a has the same construction as that for attaching the substrate 24. A heater for heating the thin film deposition sample substrate 31 may be also provides on its back face.

A X-ray incidence window 33 is provided on one face 32a of the side wall of the measuring unit 30, and a X-ray extraction window 34 is provides on the side wall face 32b facing the face 32a. These windows 33 and 34 are made of a material having a small X-ray absorbance such as beryllium.

The side wall faces 32a and 32b on which the windows 33 and 34 are formed have inner faces approximately parallel to the ascending orbit of the thin film deposition particles Sa formed by connecting the crucible 21 and sample substrate attachment member 30a. The inner faces of the windows 33 and 34 are also disposed along this inner face.

The X-ray incidence window 33 and the X-ray extraction window 34 are disposed so that their inner faces are directed in a non-symmetrical direction against the orbit of the thin film deposition particles Sa flowing into the measuring unit 30. Accordingly, since the thin film deposition particles Sa ascending from the crucible 21 through the side faces of the windows 33 and 34 toward the sample substrate attachment member 30a, adhesion of the thin film deposition particles Sa on the windows 33 and 34 can be suppressed.

The X-ray incidence window 33 is provided so that the X-ray emitted from a X-ray source 41 (to be described hereinafter) and converged with a curved monochromator 42 is irradiated through the window 33 on the surface of the sample substrate 31 mounted on the measuring unit 30.

The X-ray extraction window 34 is provided so that the X-ray reflected from the thin film deposition sample substrate 31 is guided to a X-ray detector 43 (to be described hereinafter) through the window 34.

The intensity of the incident X-ray or reflection X-ray decreases when the thin film deposition particles Sa are adhered on the windows 33 and 34 because the incident X-ray or reflection X-ray is blocked from permeating, thereby decreasing X-ray sensing accuracy. However, since adhesion of the thin film deposition particles Sa on the inner faces of the windows 33 and 34 is suppressed according to this embodiment, decrease of X-ray sensing accuracy due to decreased X-ray intensity may be prevented.

The inner faces of the side wall 32a and 32b may be inclined so that their upper parts are outwardly protruded, and the inner faces of the windows 33 and 34 may be disposed along the inner faces of the side walls. As a result, the inner faces of the windows 33 and 34 can be directed in a completely non-symmetrical direction relative to the orbit of the thin film deposition particles Sa flowing into the measuring unit 30, enabling the thin film deposition particles Sa to be more appropriately prevented from adhering.

The construction of the thin film measuring apparatus 40 will be then described with reference to FIGS. 1 and 3.

The thin film measuring apparatus 40 is composed of a X-ray irradiation unit containing the X-ray source 41 and the monochromator 42, and a X-ray sensing unit comprising the X-ray detector 43.

FIG. 3 illustrates a measuring optical system composed of the X-ray source 41, curved monochromator 42 and X-ray detector 43.

A X-ray tube emitting a divergent X-ray is used for the X-ray source 41. A fine focus tube having a focus as small as 0.1 mm or less is used for the X-ray source 41. When the focus of the divergent X-ray emitted from the X-ray source 41 is large, a slit may be placed in front of the X-ray source 41 to from a fine focus beam.

The curved monochromator 42 has a function to reflect the incident X-ray after converting it into a monochromatic X-ray to converge it. When a X-ray impinges on the curved monochromator 42, a characteristic X-ray (for example $K\alpha_1$ X-ray) is reflected depending on the crystalline material constituting the monochromator 42, and the reflected X-ray converges on a prescribed focus point. This curved monochromator 42 may be manufactured by slicing an almost perfect crystalline material such as $\alpha$-quartz, Si and Ge into a thin plate, followed by specular grinding and bending into a prescribed curvature.

The optical system comprising the X-ray source 41 and curved monochromator 42 is placed at the outside of the thin film deposition system 10 so that the focus point of the X-ray reflected by the curved monochromator 42 is positioned on the surface of the thin film deposition sample substrate 31 disposed in the measuring unit 30 (see FIG. 1).

Figure 4A:
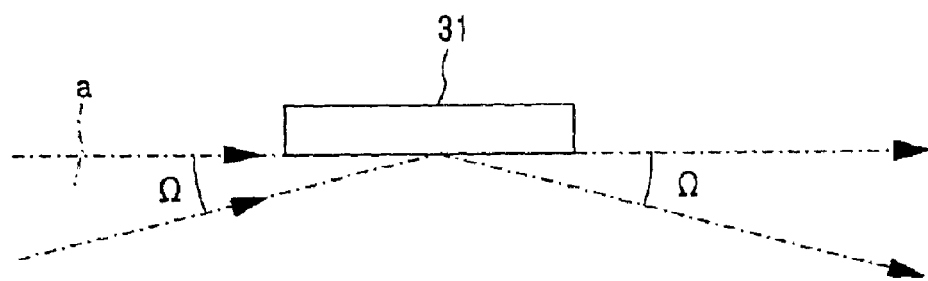
FIG. 4A illustrates an example of the X-ray incident angle to the sample substrate.

For example, X-ray measurements within a low angle range (0° to a converge angle $\Omega$°) can be simultaneously performed by adjusting one of the outer peripheries of the X-ray beam a reflected from the curved monochromator 42 to be parallel to the surface of the thin film deposition sample substrate 31 as shown in FIG. 4A.

Figure 4B:
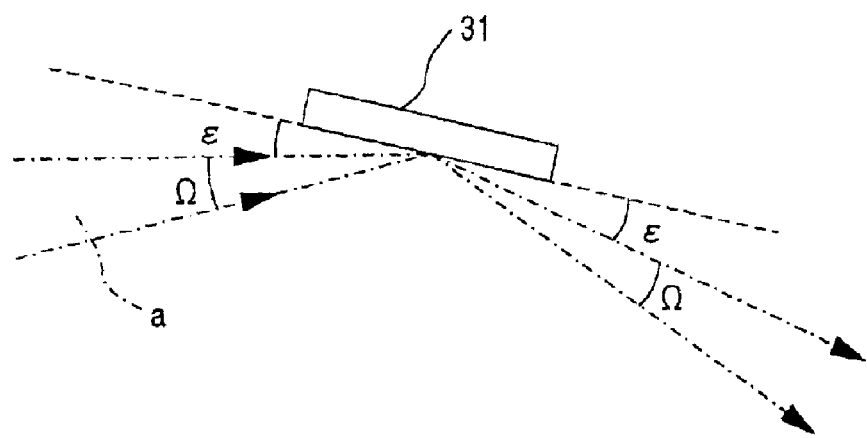
FIG. 4B illustrates another example of the X-ray incident angle to the sample substrate.

Otherwise, X-ray measurements within a low angle range of $\epsilon$° to $\Omega$° can be also simultaneously performed by allowing one of the outer peripheries of the X-ray beam a reflected from the curved monochromator 42 to tilt relative to the surface of the thin film deposition sample substrate 31 as shown in FIG. 4B.

Various materials that permits one dimensional or two dimensional sensing of the X-ray intensity may be utilized as the X-ray detector 43. For example, an imaging plate (IP), a X-ray sensing CCD or a one dimensional PSD is available as the X-ray detector 43. The X-ray detector 43 is placed at the position for receiving the reflection X-ray from the thin film deposition sample substrate 31 after permeating the X-ray extraction window 34.

The control unit 50 is composed of a data processing unit 51, a measurement control unit 52, and an electron gun control unit 53. The data processing unit 51 execute data processing on the X-ray reflectivity measurement based on the X-ray intensity sensed with the X-ray detector 43, thereby the thickness of the thin film deposited on the surface of the thin film deposition sample substrate 31 is calculated. A lines of information on the state of the interface between the surface of the thin film or the thin film and the substrate obtained by the X-ray reflection measurement, and on the density of the thin film may be also obtained from data processing at the data processing unit 51.

In the configuration according to this embodiment, adhesion conditions of the thin film deposition particles are slightly different between the thin film deposition sample substrate 31 disposed in the measuring unit 30 and the substrate 24 disposed in the thin film deposition furnace 20. Accordingly, it is inevitable that the film thickness of the thin film S2 deposited on the surface of the thin film deposition sample substrate 31 is different from the film thickness of the thin film S1 formed on the surface of the substrate 24.

Accordingly, a difference (correction value) between the data (measured data) such as the film thickness with respect to the sample substrate 31 disposed in the measuring unit 30, and the date (true data) such as the film thickness with respect to the substrate 24 disposed in the thin film deposition furnace 20 is determined in advance to the measurement in this embodiment. Then, the difference is corrected in the measured data processing unit 51 to make the measured data to coincide with the true data.

The electron gun control unit 53 controls the output of the electron gun 22 placed in the thin film deposition furnace 20. The output voltage and output time of the electron gun 22 are controlled with the electron gun control unit 53.

The measurement control unit 52 transfers a required instruction signal to the thin film measuring apparatus 40 and electron gun control unit 53. The electron gun 22 is operated with the electron gun control unit 53 with a prescribed output voltage, thereby the thin film is deposited on the substrate 24 and thin film deposition sample substrate 31. The thin film is measured, on the other hand, by operating the X-ray source 41 of the thin film measuring apparatus 40 by the instruction signal from the measurement control unit 52.

Thin film deposition and thin film measurement operations are alternatively performed, or a drive instruction signal is applied from the measurement control unit 52 to the electron gun control unit 53 to permit the electron gun control unit 53 to operate the electron gun 22. Consequently, the thin film is deposited on the substrate 24 and thin film deposition sample substrate 31 for a given period.

A halt instruction signal is given thereafter from the measurement control unit 52 to the electron gun control unit 53 to permit the electron gun control unit 53 to stop the output of the electron gun 22.

Subsequently, a drive instruction signal is given from the measurement control unit 52 to the X-ray source 41 to operate the X-ray source 41, thereby the thin film is measured with the thin film measuring apparatus 40.

Then, the measurement control unit 52 transfers a halt instruction signal to the thin film measuring apparatus 40 while importing measured data with respect to the thin film from the measured data processing unit 51. The X-ray source 41 stops output of X-ray by receiving the halt instruction signal.

Thin film deposition and thin film measurement are alternatively executed. When the measured data indicate an objective film thickness, thin film deposition and thin film measurement are completed with respect to one thin film layer.

Usually, a multilayer film comprising different deposition substances S is laminated on the surface of the substrate 24. An objective thickness is given to each thin film layer constituting the multilayer film. Accordingly, thin film deposition and thin film measurement are carried out for every thin film unit. The film thickness of the second layer and thereafter may be determined by the difference between the thickness of the currently measured layer and the thickness of the film thickness obtained by the measurement immediately before the current measurement.

For obtaining the objective film thickness with high precision, it is preferable to repeat the measurement of the film thickness with a short cycle, and thin film deposition is continued with reference to the results of measurements. However, a long time is required for depositing the thin films when the film thickness measurements are repeated with a short cycle. Therefore, basic information concerning film deposition is previously stored as a database in the measurement control unit 52. The measurement control unit 52 controls the thin film measuring apparatus 40 on the basis of this basic information.

The basic information with respect to film deposition include the relation between thin film deposition time (operation time of the electron gun 22) t in the thin film deposition system 10 and the thickness Dt of the thin film S1 formed on the substrate 24.

The measurement control unit 52 prolongs the measuring interval $t_1$ at the initial stage for forming the thin film S1 based on the basic information. Then, the measuring intervals are successively shortened as $t_2, t_3, \ldots t_n$ ($t_2 > t_3 > \ldots > t_n$) when the film thickness S1 comes close to the objective thickness $D_0$.

The process described above allows thin film deposition to be promoted, since continuous film deposition becomes possible for a relatively long period of time at the initial stage of film deposition. The objective film thickness may be also measured with high precision, on the other hand, by shortening the measuring interval as the film thickness S1 comes close to the objective thickness $D_0$. Film deposition of the thin film layer is completed when the measured film thickness has became equal to the objective film thickness.

Figure 5A:
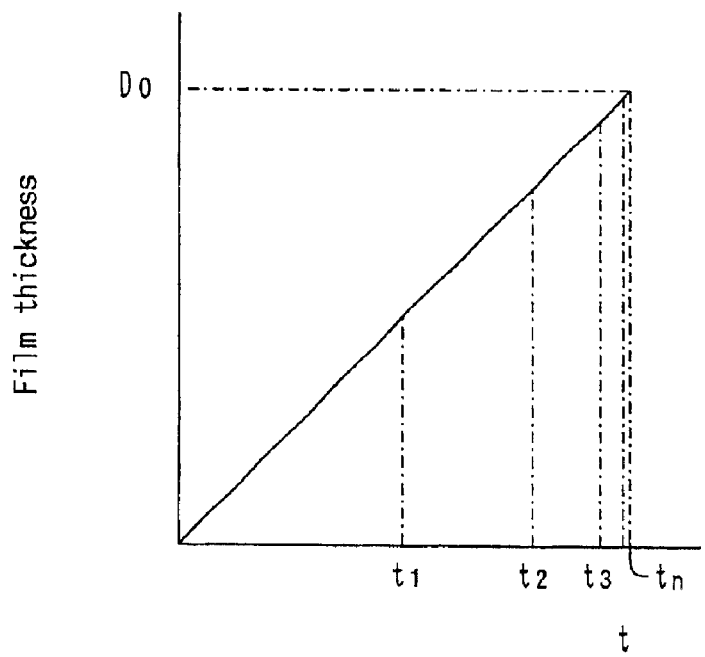
FIG. 5A is provided for describing the control method of the measurement control unit.
Figure 5B:
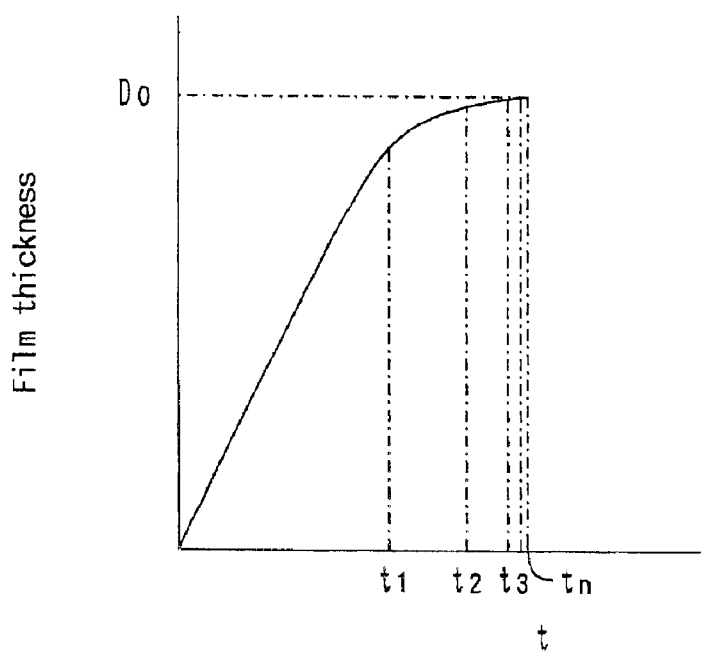
FIG. 5B is also provided for describing the control method of the measurement control unit.

Otherwise, basic information having a content by which the film deposition speed is retarded as the film thickness comes to the objective film thickness $D_0$ as shown in FIG. 5B is previously stored. Measurement of the objective film thickness is made possible with a higher precision by controlling the electron gun 22 and the film thickness measuring apparatus 40 based on this basic information. The time dependent change of output of the electron gun 22 (or the change of the amount of the generated thin film deposition particles Sa) is also included in this basic information. Film deposition may be continued by continuously measuring the film thickness when it comes close to the objective film thickness $D_0$.

The actual method for measuring the film thickness is not restricted to the measurement of X-ray reflectivity. For example, rocking curve measurement may be applied for the thin film measurement when the Bragg's angle of the thin film deposition sample substrate 31 (thin film deposition substrate 24) is known and when a mixed crystal or superlattice structure is formed on the surface of the substrate. The mean incident angle of the X-ray impinging on the surface of the thin film deposition sample substrate 31 is set to be around the known Bragg's angle in the case as described above.

The embodiment as hitherto described may be modified as follows.

For example, an exchange device for the thin film deposition sample substrate may be provided in the modified embodiment, whereby the sample substrate or the surface thereof disposed in the measuring unit 30 can be exchanged without changing the atmosphere in the thin film deposition furnace 20.

FIG. 6 shows the construction of the exchange device for the thin film deposition sample substrate, in which a sample exchange chamber 60 is provided adjacent to the measuring unit 30, and a turn table 61 turns for transfer between the measuring unit 30 and sample exchange chamber 60. The sample exchange chamber 60 is isolated from the measuring unit 30, and the gap for allowing the turn table 61 to move between the chambers is also vacuum-sealed.

Attachment members 63 for the thin film deposition sample substrate 31 are provided on the turn table 61 at symmetrical sites relative to the center of a rotation axis 62. The turn table 61 turns after completing thin film measurement of the thin film deposition sample substrate 31 attached on one of the attachment members 63, thereby the other thin film deposition sample substrate 31 attached on the other attachment member 63 can be disposed at the measuring unit 30.

The thin film deposition sample substrate 31 on which a thin layer has been deposited is taken out through a door 64 at the sample exchange chamber 60. After removing the thin film deposition sample substrate 31, a fresh thin film deposition sample substrate 31 is attached to the attachment member 63.

A vacuum evacuation device 65 is provided at the sample exchange chamber 60, and the air flowing in by opening the door 64 is again evacuated.

Figure 7:
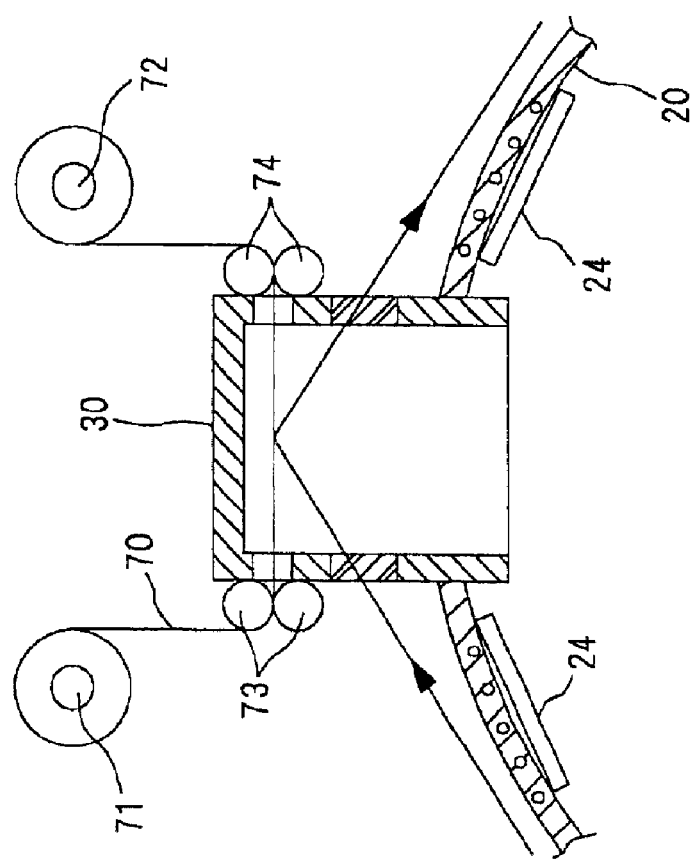
FIG. 7 a cross section of the construction showing another example of the exchange device for the thin film deposition sample substrate.

FIG. 7 shows another construction of the exchange device for the thin film deposition sample substrate.

The exchange device for the thin film deposition sample substrate shown in FIG. 7 pulls out a ribbon of the sample substrate 70 from a feed reel 71, and withdraws into a withdrawal reel 72 via the measuring unit 30.

Guide rollers 73 and 74 for disposing the sample substrate at a given position while sealing the disposed measuring unit 30 are provided at the inlet and outlet of the measuring unit 30.

A thin film layer is deposited on the sample substrate 70 disposed in the measuring unit 30. The deposited portion of the sample substrate 70 is withdrawn on the roller after completing thin film measurement of the layer, and a fresh portion of the substrate is disposed in the measuring unit 30.

The thin film can be measured independently for each tin film layer by providing the exchange device for the thin film deposition sample substrate as described above.

The X-ray incidence direction and sensing direction may be appropriately adjusted by allowing the sample substrate disposed in the measuring unit to tilt at an angle within 45° relative to the ascending direction of the thin film deposition particles, even when the site for placing the X-ray measuring apparatus is restricted for some reasons.

Second Embodiment

Figure 8:
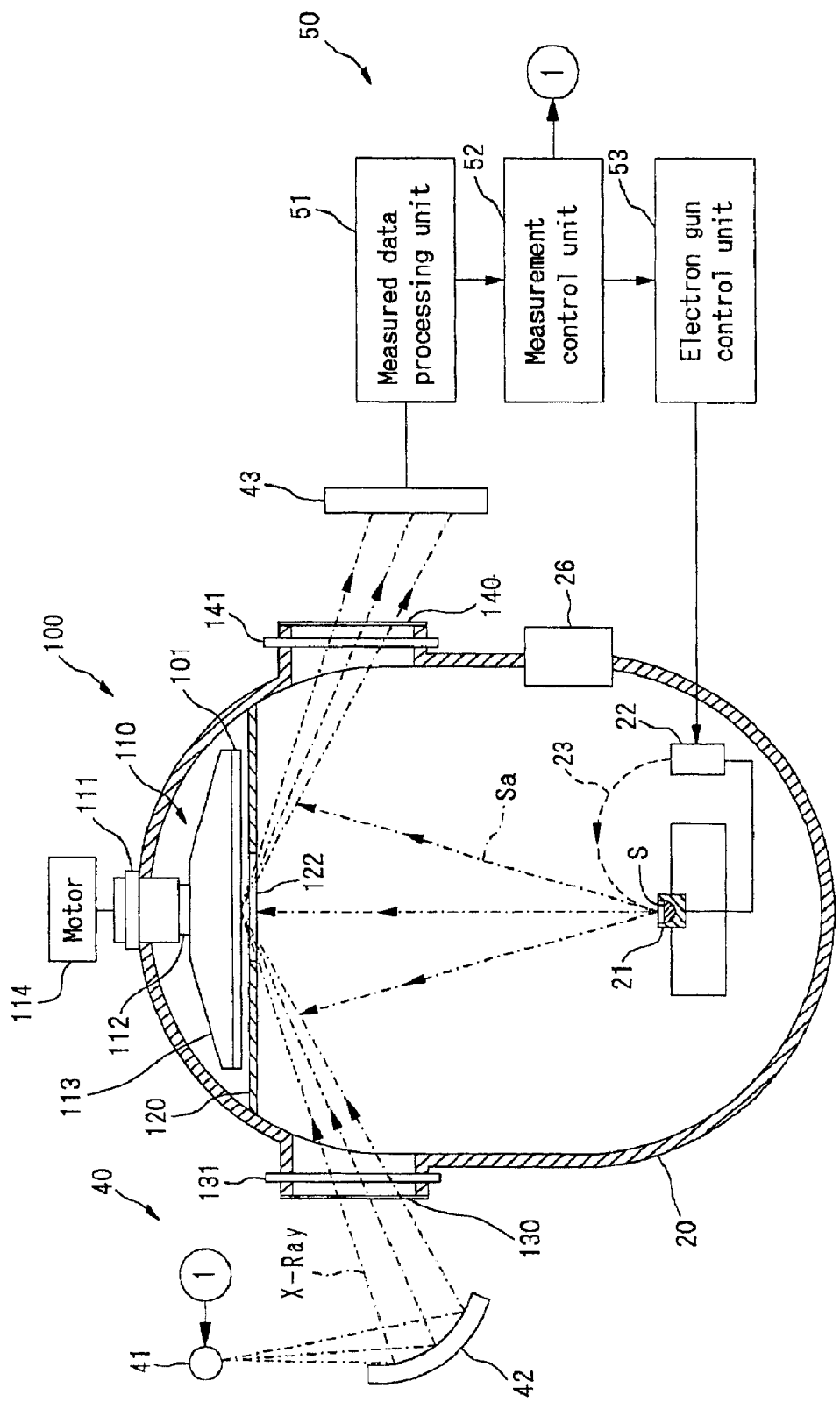
FIG. 8 is a cross section showing the construction of the thin film deposition system according to the second embodiment of the present invention.
Figure 9:
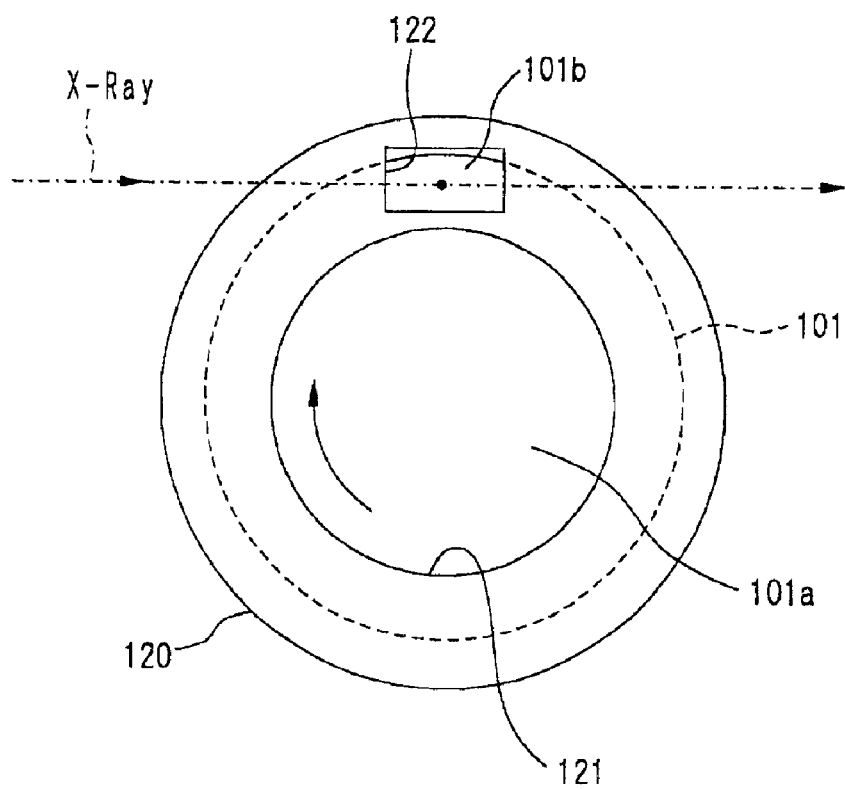
FIG. 9 shows the shielding plate of the thin film deposition system shown in FIG. 8 viewed from the bottom.
Figure 10:
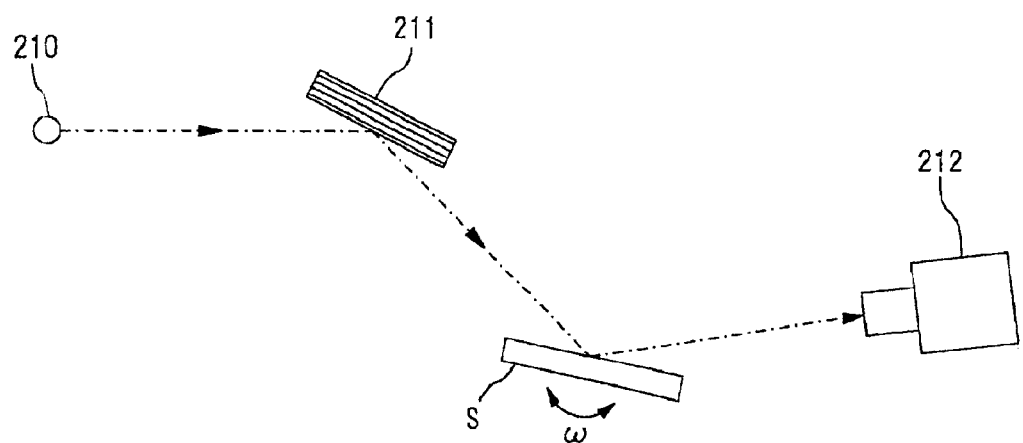
FIG. 10 illustrates the principle for measuring the rocking curve.
Figure 11:
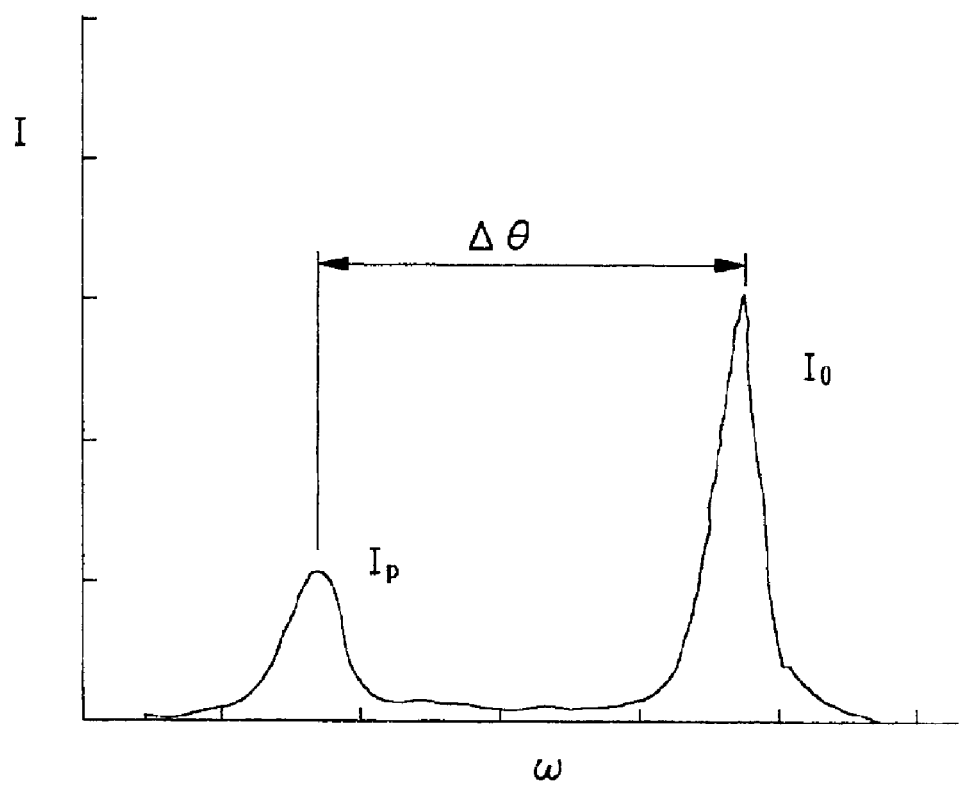
FIG. 11 shows one example of the rocking curve.
Figure 12:
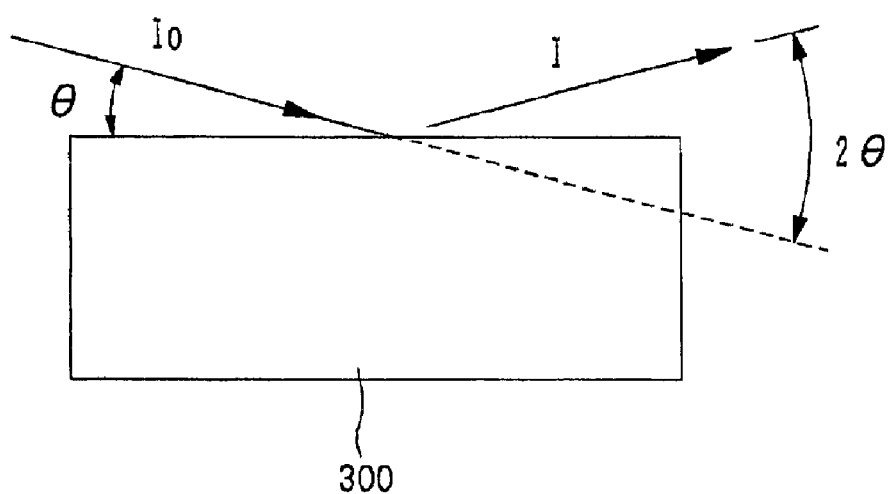
FIG. 12 illustrates the principle for measuring X-ray reflectivity.
Figure 13:
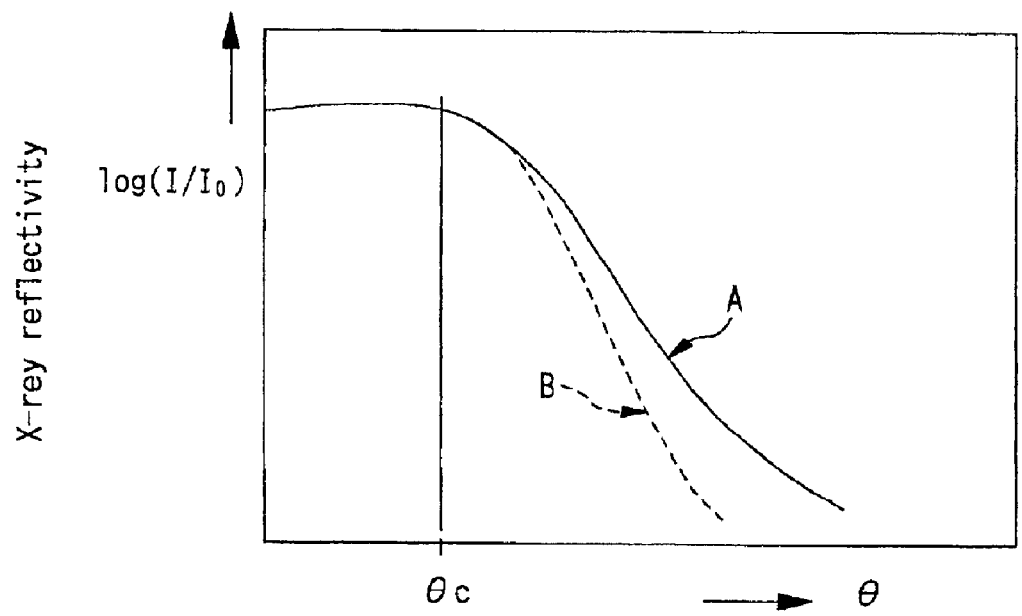
FIG. 13 shows one example of the X-ray reflectivity curve.
Figure 14:
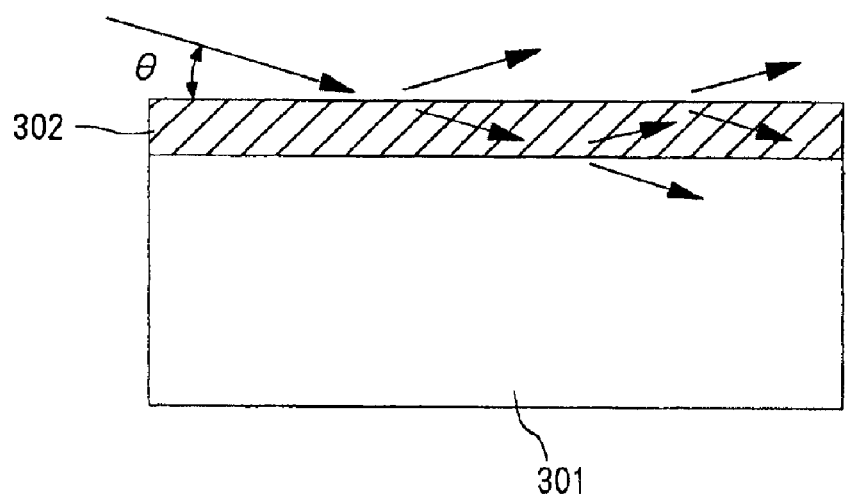
FIG. 14 further illustrates the principle for measuring X-ray reflectivity.
Figure 15:
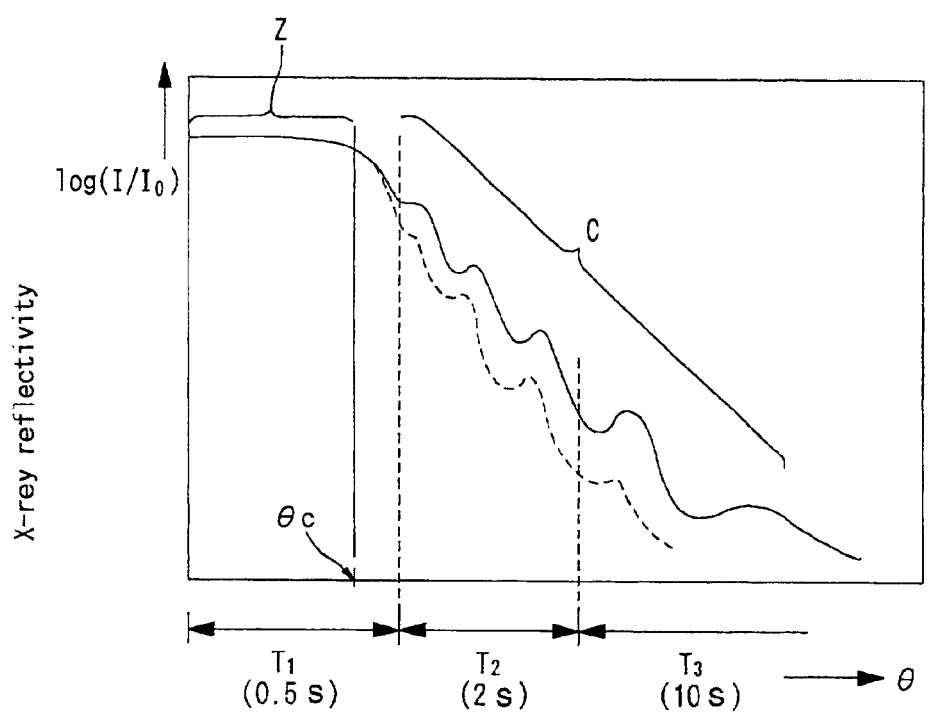
FIG. 15 shows another example of the X-ray reflectivity curve.

FIG. 8 is a cross section showing the construction of the thin film deposition system according to the second embodiment of the present invention. FIG. 9 shows the shielding plate of the thin film deposition system shown in FIG. 8 viewed from the bottom.

The constitution elements having the same reference numerals as those in FIG. 1 among the constitution elements of the thin film deposition system shown in FIG. 8 involves the same constitution elements of the thin film deposition system 10 in the first embodiment.

The thin film deposition system 100 shown in FIG. 8 comprises a substrate support member 110 at the ceiling of the thin film deposition furnace 20, and a shield member 120 facing the surface of a thin film deposition substrate 101 supported with a thin film deposition support member The thin film deposition support member 110 is composed of a rotation axis 112 supported with a bearing 111 provided at the top of the thin film deposition furnace 20 to be freely ratable, and a substrate attachment member 113 fixed at the lower end of the rotation axis 112. The thin film deposition substrate 101 is mounted at the bottom of the substrate attachment member 113 at a position to be opposed to the crucible 21.

A driving motor 114 as a rotary drive device is connected to the rotation axis 112. The thin film deposition substrate 101 attached to the substrate attachment member 113 is allowed to rotate with this driving motor 114.

As shown in FIG. 9, the shield member 120 is an annular member having an opening 121 for depositing the thin film at the center. The thin film deposition particles Sa generated from the crucible 21 adhere on the surface at the center of the thin film deposition substrate 101 to form thin films.

An opening 122 for depositing a sample thin film is further formed at a part of the peripheral surface of the shield member 120. The thin film deposition particles Sa generated from the crucible 21 adhere on a part of the surface 101b of the thin film deposition substrate facing the opening 122 to form thin films.

No measuring unit 30 (see FIG. 1) is provided in this embodiment, and the X-ray incidence and extraction windows 130 and 140 are provided on the side walls of the thin film deposition furnace 20. These windows 130 and 140 are made of a material having small X-ray permeability such as beryllium. Shutters 131 and 141 for blocking the X-ray are provided at the insides of the windows 130 and 140. These shutters 131 and 141 are open for thin film measurement, and closed during deposition of the thin film to prevent the thin film deposition particles Sa from adhering on the shutters 131 and 141.

The X-ray emitted from the X-ray source 41 and converged with the curved monochromator 42 is irradiated on a part of the surface 101b of the thin film deposition substrate 101 through the X-ray incidence window 130 and the opening 122 for depositing the sample thin film, and is reflected by the thin film deposited on a part of the surface 101b.

The reflected X-ray from the thin film is sensed by the X-ray detector 43 through the opening 122 for depositing the sample thin film and X-ray extraction window 140. The X-ray measurement methods such as reflectivity measurement and rocking curve measurement are also used for measuring with the thin film measuring apparatus 40 as in the first embodiment.

According to the thin film deposition system as describe in this embodiment, each thin film deposited as a layer at the center 101a of the surface of the thin film deposition substrate 101 through the opening 121 for depositing the thin film may be independently analyzed for each layer.

In other words, the same thin film as the thin film layer of at the center 110a of the surface is deposited on a part 101b of the surface of the thin film deposition substrate 101 facing the opening 122 for depositing the sample thin film in the process for depositing one thin film layer at the center 101a of the surface of the thin film deposition substrate 101 through the opening 121 for depositing the thin film.

Analysis of one thin film layer formed at the center 101a of the surface is possible by X-ray measurement of the thin film deposited on a part 101b of the surface.

Subsequently, the surface part of the thin film deposition substrate 101 facing the opening 122 for depositing the sample thin film is changed by rotating the thin film deposition substrate 101 by means of the drive motor 114.

In the next process for depositing the thin film, a fresh thin film is deposited on the surface portion facing the opening 122 for depositing the sample thin film. This thin film is almost the same as the thin film layer that has been freshly deposited and laminated at the center 101a of the surface of the thin film deposition substrate 101 through the opening 121 for depositing the thin film.

Accordingly, the thin film layer freshly deposited and laminated at the center 101a of the surface of the thin film deposition substrate through the opening 121 for depositing the thin film can be analyzed by X-ray measurement of the thin film deposited on the surface portion facing the opening 122 for depositing the sample thin film.

And others, two or more layers of thin film can also be measured collectively by measurement of the X-ray reflectivity.

What is claimed is:

1. A thin film deposition system comprising:

a sealed thin film deposition furnace having an X-ray permeable X-ray incidence window and X-ray extraction window;

thin film substance generating means for generating thin film deposition particles of the thin film substance in the thin film deposition furnace;

substrate supporting means for supporting a thin film deposition substrate in the thin film deposition furnace at a position for allowing the thin film deposition particles of the thin film deposition substance generated from the thin film substance generating means to adhere on the surface of the substrate;

a shield member facing the surface of the thin film deposition substrate supported in the thin film deposition furnace;

a thin film deposition opening formed at a part of the shield member and for allowing a part of the thin film deposition substrate to expose so that the thin film deposition particles of the thin film deposition substance generated from the thin film substance generating means are adhered on the exposed part;

a sample thin film deposition opening formed at another part of the shield member and for allowing another part of the thin film deposition substrate to expose so that the thin film deposition particles of the thin film deposition substance generated from the thin film substance generating means are adhered on the another exposed part;

rotary drive means for relatively changing a part of the surface facing the sample thin film deposition opening by allowing the thin film deposition substrate to rotate;

an X-ray irradiation unit disposed at the outside of the thin film deposition furnace and irradiating an X-ray through the X-ray incidence window and the sample thin film deposition opening toward a part of the surface of the thin film deposition substrate supported in the thin film deposition furnace; and an X-ray sensing unit disposed at the outside of the thin film deposition furnace and sensing the X-ray reflected from a part of the surface of the thin film deposition substrate through the sample thin film deposition opening and the X-ray extraction window, the X-ray irradiation unit comprising an X-ray source for emitting a divergent X-ray, and a curved monochromator for at least converting the divergent X-ray emitted from the X-ray source into a monochromatic X-ray and for allowing the monochromatic X-ray to converge on the thin film deposition surface of the thin film deposition sample substrate.

2. A thin film deposition system according to claim 1, wherein the rotary drive means allows the thin film deposition substrate to rotate for every each or plural processes for depositing each thin film layer formed on a part of the surface of the thin film deposition substrate through the thin film deposition opening, in order to change a part of the surface facing the opening for the sample thin film deposition substrate.

3. A thin film deposition system according to claim 1 wherein, on the premise that the rocking curve is measured based on the data from the X-ray sensing unit using as a measuring object a thin him having a mixed crystal structure or superlattice structure formed on the surface of the thin film deposition substrate having a known Bragg's angle, the X-ray irradiation unit has a mean X-ray incident angle for allowing the X-ray to impinge on the thin film on the surface of the thin film deposition substrate with an angle set at around the known Bragg's angle.

4. A thin film deposition system according to claim 1 wherein, on the premise that X-ray reflectivity is measured, the X-ray irradiation unit has an X-ray incident angle for allowing the X-ray to impinge on the thin film on the surface of the thin film deposition substrate with an angle set at a low angle range required for measuring X-ray reflectivity.

5. A thin film deposition system according to claim 1, further comprising a control unit for controlling, by previously storing desired basic information for forming a thin film in the thin film deposition furnace, at least forming of the thin film and measurement of the thin film formed on the surface of the thin film deposition substrate based on the basic information.

* * * * *